United States Patent [19]

Blitchington et al.

[11] Patent Number: 4,965,208
[45] Date of Patent: Oct. 23, 1990

[54] INSPECTION OF MULTIPATTERN CIRCUIT BOARDS

[75] Inventors: Frank H. Blitchington, Richmond, Va.; Edwin A. Chandross, Berkeley Heights; Lloyd Shepherd, Madison, both of N.J.

[73] Assignee: AT&T Bell Laboratories, Murray Hill, N.J.

[21] Appl. No.: 144,763

[22] Filed: Jan. 19, 1988

Related U.S. Application Data

[63] Continuation-in-part of Ser. No. 834,556, Feb. 28, 1986, abandoned, which is a continuation of Ser. No. 518,455, Jul. 29, 1983, abandoned.

[51] Int. Cl.$^5$ .................... G01N 21/64; B32B 15/08; B32B 27/38
[52] U.S. Cl. ........................................ 436/5; 250/362; 250/459.1; 428/418; 428/901
[58] Field of Search .................... 436/5; 428/418, 901; 250/362, 459.1

[56] References Cited

U.S. PATENT DOCUMENTS 4,152,723  5/1979  McMahon et al. .
4,774,188  9/1988  Chandross ........................ 436/5

OTHER PUBLICATIONS

H. Lee and K. Neville, *Handbook of Epoxy Resins*, McGraw-Hill, New York (1967), Chapter 11, p. 11.
A. N. Chianciarulo and R. L. Webb in *Proceedings of the 23rd Annual Technical Conference*, Reinforced Plastics/Composites Division, the Society of the Plastic Industry, Incorporated, 1968, Section 5B, pp. 1-6.

*Primary Examiner*—Robert J. Warden
*Assistant Examiner*—Jill Johnston
*Attorney, Agent, or Firm*—Bruce B. Schneider

[57] ABSTRACT

Circuit boards with advantageous properties are produced through the addition of a fluorescent dye. The presence of the dye allows an expeditious inspection of the metallic pattern on the circuit board by induced fluorescence. If the circuit board is two-sided, to maintain the effectiveness of the dye, a material such as a light scattering composition is added to the circuit board substrate.

14 Claims, 2 Drawing Sheets

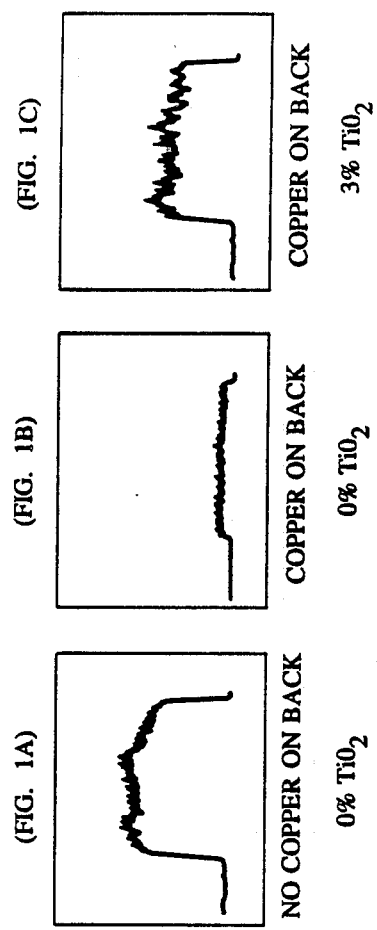
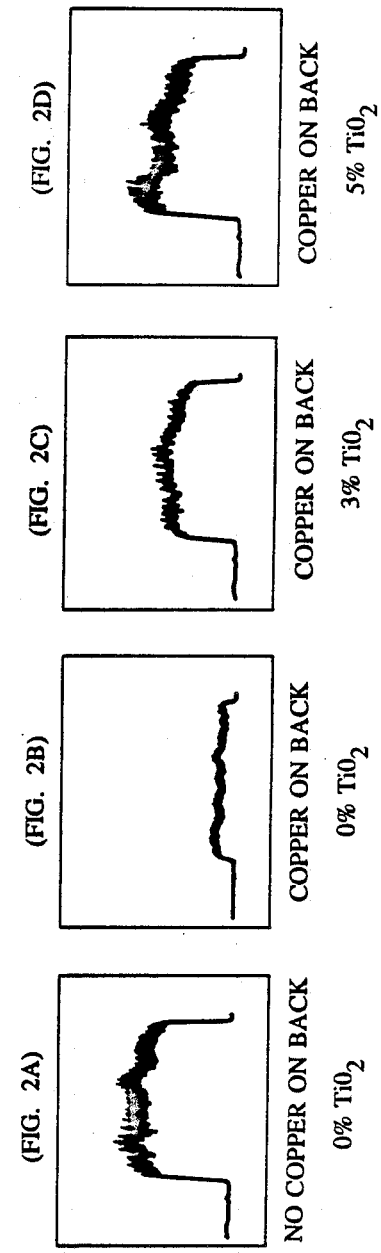

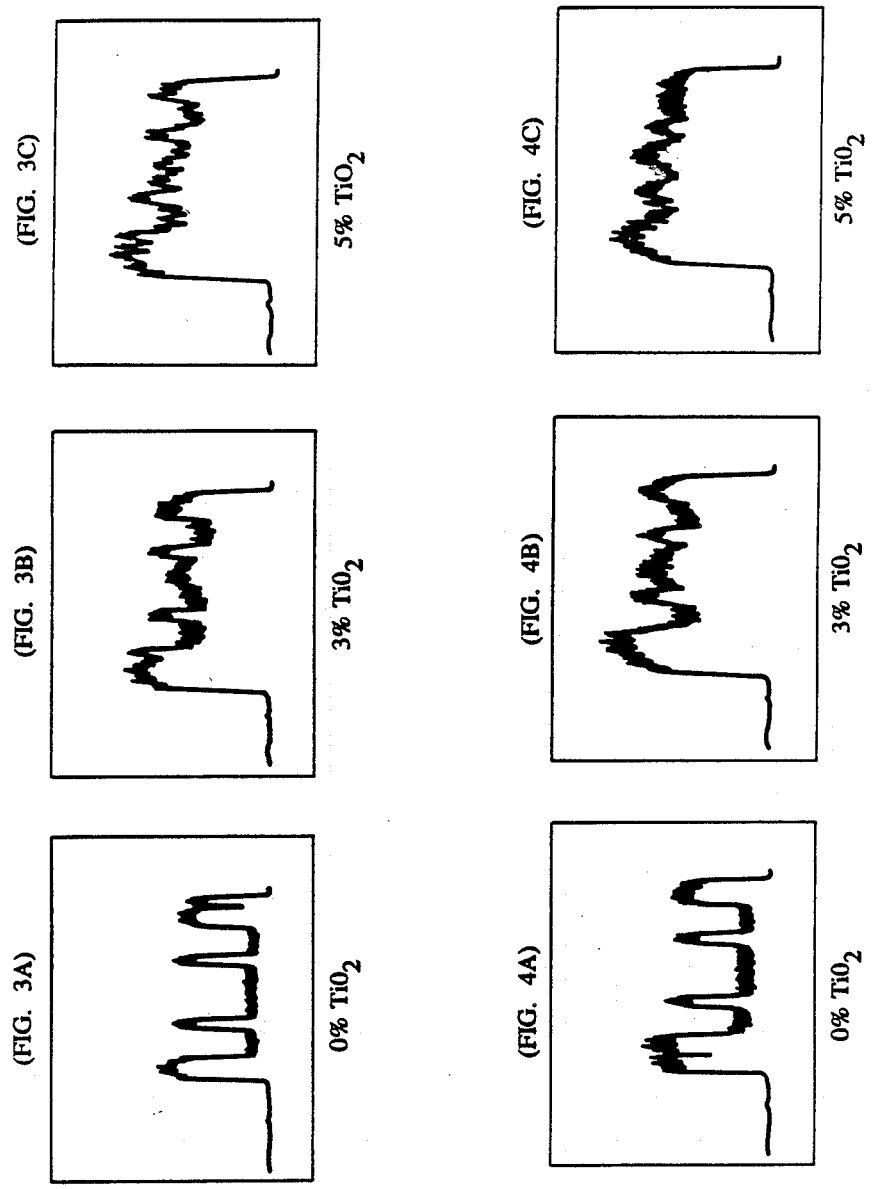

INSPECTION OF MULTIPATTERN CIRCUIT BOARDS

CROSS REFERENCE TO RELATED APPLICATIONS

This application is a continuation-in-part of U.S. patent application Ser. No. 834,556 filed Feb. 28, 1986, now abandoned and refiled as 07/144,736 on Jan. 15, 1988, which is now U.S. Pat. No. 4,774,188, which in turn is a continuation of U.S. patent application Ser. No. 518,455 filed July 29, 1983, abandoned, which are all hereby incorporated by reference.

BACKGROUND OF THE INVENTION

1. Field of the Invention

This invention relates to electronic equipment and, in particular, to printed circuit boards.

2. Art Background

Printed circuit boards are widely used in electronic equipment. In such boards generally a metallic, e.g., copper, pattern is produced on a polymer substrate. The substrates are typically fabricated by impregnating or coating a lacquer including the desired resin, for example, an epoxy resin, onto a reinforcing grid such as a fiber glass mesh. A variety of methods are employed to produce the copper pattern. These methods typically involve a lithographic process and a wet etching process which, although quite reliable, sometimes yield irregularities in the desired pattern. For example, discontinuities or width narrowing or broadening in metallic pattern lines are encountered. Such irregularities often lead to the degradation of component properties and ultimately to equipment failure.

It is desirable to detect irregularities before further processing occurs. After the metal pattern is produced, electronic components are affixed to the pattern through various expedients such as soldering. Obviously, if the pattern produces a failure after the components are affixed, a large expense is incurred in either replacing the board or, alternatively, in discovering the point of failure and repairing it. In contrast, if the irregularity is detected before affixing of the electronic components, the relatively inexpensive board is either discarded or expeditiously repaired.

Various ways have been investigated to determine the presence of pattern flaws before installation of circuit components. For example, as disclosed in U.S. Pat. No. 4,152,723, filed May 1, 1979 (which is hereby incorporated by reference), pattern flaws are detectable using a luminescence technique. In particular, a light source such as a laser is employed to induce a fluorescence in the polymer substrate. Only the portions of the substrate which are not covered by the metallic pattern are illuminated and thus fluoresce. The ambits of the metallic pattern are to an extent determined by sweeping a light beam across the patterned surface and monitoring with conventional equipment, such as a photomultiplier, the fluorescence intensity fluctuations during the sweep. However, this technique does not lead to the reliable observation of pattern flaws.

SUMMARY OF THE INVENTION

The reliable and expeditious detection of pattern flaws in printed circuit boards is achieved by utilizing a carefully chosen combination of resin and dye in conjunction with a specific process. In particular, the substrate of the printed circuit board is prepared with a spatially homogeneous distribution of a fluorescent dye having a ring system represented by the formulae

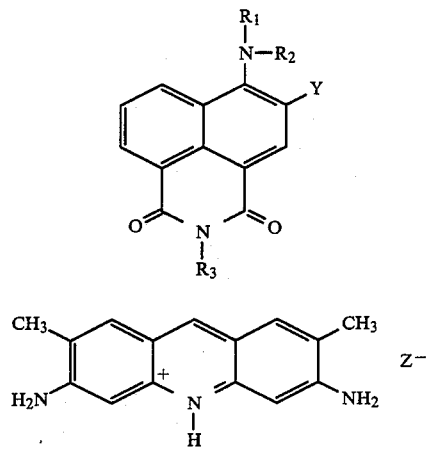

These resin compositions are easily excited using a He-Cd laser operating, for example, at 442 nm, and fluorescence is stimulated in a conveniently detected spectral region, e.g., 460 to 550 nm. Stimulation of emission and subsequent monitoring utilizing conventional techniques allow detection of pattern flaws as small as 50 $\mu$m.

It has also been found that the presence of a metallized pattern on both major surfaces of a substrate thinner than approximately 1.25 mm substantially affects the detection process. For example, the presence of a copper pattern on one side of the substrate induces a strong attenuation of the signal being detected during examination of the metallized pattern on the opposing major surface. This attenuation is prevented by introducing a scattering material, e.g., titanium dioxide particles, into the substrate together with the dye.

BRIEF DESCRIPTION OF THE DRAWINGS

FIGS. 1-4 illustrate results achievable with the invention.

DETAILED DESCRIPTION

Through the use of specific substrate compositions, advantageous and expeditious determination of flaws in printed circuit board patterns is possible. The dye employed in the substrate composition should fulfill certain criteria. The dye should not substantially alter the desired physical or electrical properties of the substrate. For example, it is possible that the use of a highly ionic dye will increase the conductivity of the substrate and thus substantially degrade the insulation resistance necessary to prevent electrical conductivity between disjoint sections of the metallic pattern. Similarly, a dye which degrades the physical integrity of the substrate, e.g., a dye which causes decomposition, or curing or premature aging of the substrate resin through reaction, is also undesirable and should be avoided. Dyes which migrate to the substrate surface and produce undesirable results such as affecting the bond to the patterned metal also should be avoided.

The dye should be essentially homogeneously dispersed in the substrate, i.e., the average fluorescence intensity of regions $10^4(\mu m)^2$ in area should vary on average less than 10 percent over all patterned regions of the circuit board. Generally to satisfy this criterion, it is necessary to find a dye which easily disperses directly into the resin, or to find a dye which is co-soluble in the vehicle, e.g., lacquer, employed to produce the circuit board substrate.

The dye should also satisfy certain optical criteria. The fluorescence induced should preferably have a substantial fraction of its intensity below a wavelength of 520 nm. Typically, if fluorescence occurs at longer wavelengths, detection of the fluorescence by using conventional expedients is significantly more difficult. Substantial fluorescence below 460 nm, although acceptable, is generally not produced. For single photon processes, the induced fluorescence occurs at wavelengths which are longer than that of the exciting light. Convenient light sources, such as the He-Cd laser, typically emit at wavelengths above 420 nm. It is preferred to employ a laser since it is easily possible to focus the source to a spot size which is smaller than the smallest metal pattern dimension while preserving intensity. Thus, fluorescence below 420 nm for a convenient light source is generally not presently available.

The observable fluorescence intensity produced by the dye should be at least 10 times greater than the level of fluorescence produced in the substrate in the absence of the dye. Light absorbed farther than 1 mm from the illuminated surface results in fluorescence which is substantially dispersed within the substrate and thus is not readily detected. A dye concentration within 1 mm of the substrate surface of 0.5 to 0.005 percent by weight generally produces the desired absorption and, for typical light sources such as He-Cd laser, yields adequate fluorescence. A control sample is employed to determine the precise dye concentration suitable for a desired absorption level. However, a dye concentration of greater than 1 percent typically produces a dark colored substrate and thus should be avoided.

The dye also should not migrate in the substrate. Such migration leads to inhomogeneities and the previously discussed adverse consequences.

All the previous criteria involved in the subject invention are satisfied by utilizing a dye having a structure based on

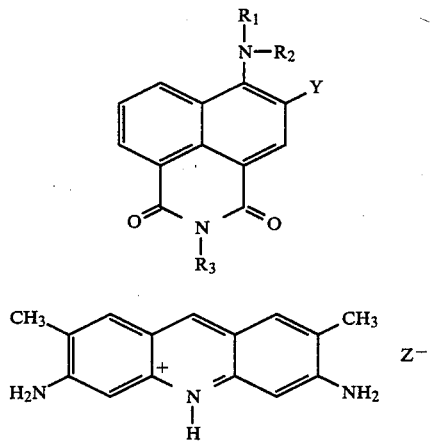

where Y is $SO_3G$ (G being an alkali metal cation) or H, $R_1$ and $R_2$ are individually hydrogen, methyl or ethyl, $R_3$ is a group such as H, a lower alkyl (preferably less than 5 carbon atoms), p-tolyl, or xylyl, where $Z^-$ is $Cl^-$, $Br^-$, $I^-$, $NO_3^-$, or p-toluenesulfonate. Compound (2) is homogeneously dispersible in resins such as epoxy resins, e.g., bisphenol-A diglycidyl ether resins, by the simple expedient of dissolving and/or dispersing the dye in the resin lacquer.

The dyes of composition (1) are also dissolvable and/or dispersible as discussed for the composition (2) dyes. Alternatively, the composition (1) dyes are sufficiently soluble in typical lacquer vehicles such as N,N-dimethylformamide or N-methylpyrrolidone. Therefore, it is possible to form a solution including both the resin and the dye as a lacquer. Similarly, for the composition (1) dye it is preferable to improve the solubility by modifying the parent chromophore (Y, $R_1$, $R_2$, and $R_3$ all being H) by reacting it initially with an excess of bisphenol-A diglycidyl ether. (For example, at least two moles of the bisphenol-A diglycidyl ether are employed for every mole in the dye composition.) This reaction yields a much more soluble dye composition having reactive epoxy groups. The dye solution is then combined with the resin in lacquer form. This lacquer is then applied by conventional techniques to a glass mesh to produce a glass fiber reinforced polymer substrate. Since the dye is modified to contain epoxy groups, it reacts as the resin cures and thus is chemically bound within the resin without substantially changing the mechanical or electrical properties of the resin and without changing the fluorescence properties of the dye. Thus, a homogeneous distribution which has long-term stability is advantageously produced. Although this reaction procedure is described in terms of an epoxy resin, it is similarly possible to modify the dye to have reactive groups consistent with the use of other substrate resins.

Often a curing agent is employed to harden the resin, for example, in the case of epoxy resins, curing agents such as dicyandiamide are employed. Substantial destruction of this curing agent before initiation of curing is disadvantageous. The composition (1) and (2) dyes do not substantially react with typical curing agents at nominal temperatures and thus do not significantly decrease their efficacy. Additionally, these dyes do not cause premature hardening of the resin.

Although many printed circuit boards are produced with metallized patterns on only one major surface of the substrate, a significant number have metallized patterns on both major surfaces. The subject process is advantageously utilized for both configurations. However, it has been found that there is a substantial optical interaction between patterns on opposite sides of a circuit board for boards thinner than 1.25 mm, and certain precautions are advantageously taken in this situation. For example, when copper patterns are being utilized, and are present on the back side, the detected signal is substantially attenuated relative to the signal observed when no pattern is present on the opposing surface of the substrate. A contemplated explanation is that the copper pattern, due to the processing required to insure its adhesion to the substrate, becomes strongly absorbing at its interface with the substrate. This absorption (by a mechanism which has not been resolved but which is believed to involve several internal reflections from the back surface) reduces the amount of fluorescence observed emanating from the irradiated substrate surface. Similarly, for metal patterns that have, after processing, a reflective surface at the interaction between the substrate and the metallized patterns, an undesirable enhancement of fluorescence is expected. To prevent these disadvantageous interactions, it is necessary to introduce a material into the substrate that prevents penetration of the exciting and/or fluorescent light to the backside interface. (It is also possible to introduce additional dye, but this procedure is not preferred because it gives the circuit board an unattractive appearance.) The material utilized to produce scattering is not critical. Particles of materials such as titanium dioxide, calcium carbonate, barium sulfate, and zinc oxide are suitable. The concentration of scattering material introduced into the substrate should be sufficient so that the fluorescence detected in the absence of an opposing metallized pattern is changed no more than 50 percent in the presence of an opposing metallized pattern. Generally, the introduction of scattering particles having an average diameter in the range 0.1 to 25 $\mu$m in a concentration of from 2 to 10 percent by weight yields the desired results. Typically, concentrations greater than 10 weight percent are not desirable since the mechanical stability of the substrate is adversely affected. Similarly, levels lower than 2 percent by weight, although not precluded, are generally insufficient to produce the desired effect. However, the thinner the substrate, the greater the concentration of filler that is required.

Scattering material is easily introduced into the substrate. For example, before the glass reinforcement is introduced into the lacquer to produce the substrate as described by H. Lee and K. Neville, *Handbook of Epoxy Resins*, McGraw-Hill, New York (1967), Chapter 22, p. 11, the scattering particles are dispersed in the lacquer. Since the lacquer is relatively viscous and the particles are relatively small, no significant settling is experienced. The dispersion of the scattering particles in the lacquer, in turn, produces a similar desirable dispersion of the particles in the finished substrate. The metallized patterns are then produced on the substrate by conventional techniques.

EXAMPLE 1

Printed circuit boards meeting the FR-4 specification of the National Electrical Manufacturer's Association were prepared as described by A. N. Cianciarulo and R. L. Webb in *Proceedings of the 23rd Annual Technical Conference*, Reinforced Plastics/Composites Division, the Society of the Plastic Industry, Incorporated, 1968, Section 5B, pp. 1–6. This procedure, however, was modified by introducing a dye into the resin or into the resin solvent. Three dyes were individually employed in the fabrication of circuit boards. The first and second dyes, Acridine Yellow G (the compound previously denominated (2) with Z=Cl) and Brilliant Sulphaflavine (the compound previously denominated (1) with $R_1=R_2=H$, $R_3=$p-tolyl, and $Y=SO_3Na$), respectively, were dispersed directly in the solvent and were utilized in the fabrication procedure.

A third dye was incorporated into the resin. The dye was prepared by adding 4-amino-1,8-naphthalimide (0.24 mole, 50.4 g) and bisphenol-A diglycidyl ether (0.48 mole, 163.2 g) to 1-methyl-2-pyrrolidinone (287 g). The mixture was heated at 155° C. under nitrogen while being agitated utilizing a mechanical stirrer. This heating and agitation was continued for approximately 6 hours to ensure that the solids had dissolved and then the mixture was heated and agitated for an additional 2 hours. The solution was then cooled and filtered through Celite ® (a filter aid, manufactured by Johns Manville Corporation, primarily finely divided $SiO_2$) to yield a solution having a concentration of 10.1 percent by weight based on the aminonaphthalimide chromophore. The dye solution was then added to a resin solution in dimethylformamide to yield a 0.01 percent by weight concentration of the dye (expressed as the parent chromophore) in the resin.

EXAMPLE 2

The circuit boards of Example 1 were inspected using a 5 mW He-Cd laser focused to a $\leq 20$ $\mu$m spot size. The fluorescence induced by this laser was detected utilizing a photomultiplier. A cut-off filter placed before the photomultiplier was utilized to remove the dominant wavelengths of the laser. The luminescence intensity observed upon scanning the laser across the board was compared to the pattern expected for a perfectly formed circuit board. Defects as small as 50 $\mu$m were observed.

EXAMPLE 3

A master batch of resin was prepared by adding 10.5 g of dicyandiamide and 11.2 grams of titanium dioxide in the form of Titanox 2020 supplied by NL Industries to 500 g of epoxy resin. The epoxy resin was a solution supplied by General Electric and identified as number 13330 which is basically a 70 percent solids in a volatile solvent. The mixture was mixed for 5 minutes at 1800 rpm in a high shear dissolver. Approximately 0.07 g of a 5.4 percent solution in 1-methyl-2-pyrrolidinone of the fluorescent dye identified as the third dye in Example 1 was combined with 0.15 g of benzyldimethylamine and added to a 50 g aliquot of the master resin. The mixture was stirred until the color was uniform.

This epoxy resin containing titanium dioxide and the dye was coated onto both sides of a five-inch glass fabric sheet. The glass fabric sheets had the following characteristics.

| Style | Manufacturer | Construction (WarpxFill) | Weight (oz/yd$^2$) | Thickness (mil) | Finish |
|---|---|---|---|---|---|
| 7628 | Clark Schwebel | 44 × 32 | 6.00 | 6.7 | CS-340 |
| 1080 | Burlington Glass | 60 × 47 | 1.40 | 1.9 | I-617 |

(Finishes I-617 and CS-340 are proprietary epoxy compatible silanes used in high pressure laminating.) The glass fiber was impregnated with the resin utilizing a bar coater. The bars of the coater were gapped at 14.8 mils and 5.2 mils for glass styles 7628 and 1080, respectively. Several grams of the resin solution were poured and spread on each side of the glass fabric and the sheets were passed between the stainless steel cylindrical bars of the coater. The coated fabrics were allowed to hang dry overnight. The dried bodies were then cured for 1 hour at 95° C. in a circulating air oven.

Copper foil was clad on one side of the laminate. The copper foil was coated on one side with electrodeposited brass and on both sides with a chromium electrodeposition. The treated foil was adhered to the laminate by applying heat and pressure. Two substrates, each having one surface with a copper foil, were stacked with the copper foils on the outside. The stack was placed between ¼" stainless steel caul plates with an intervening 10 mil thick FEP release sheet. (This release sheet is a proprietary product of E. I. DuPont de Nemours & Company.) The stack was formed into a monolithic body by inserting the stack together with the steel cauls into a PHI electric press, using a hot-to-cold press cycle. The temperature was set at 340° F. and the cure was promoted for 45 minutes at 200 psi. The press was subsequently cooled under pressure to 30° C. and then opened to remove the laminate.

A similar substrate was formed by the same procedure except titanium dioxide was omitted from the initial resin. For this unpigmented body, the intensity of the fluorescence as measured by a photomultiplier pick up tube from the front surface depended strongly on the presence of copper cladding material on the backside. Where copper is present on the back, frontal fluorescence was reduced as much as 70 percent. As shown in FIG. 1 at A and B as well as in FIG. 2 at A and B, when the back copper is unpatterned, the effect is particularly pronounced. As shown, however, in FIG. 3 at A and FIG. 4 at A, the presence of a copper circuit pattern on the backside still produces a significant effect. As shown in FIG. 1 at C and FIG. 2 at C and FIG. 3 at B and FIG. 4 at B, for the films having the pigment at a 3 percent by weight titanium dioxide presence, the fluorescence intensity of copper-backed film reaches about 70 percent of the value obtained for films with no backside copper. As shown in FIG. 2 at D, FIG. 3 at C and FIG. 4 at C, the use of 5 percent by weight titanium dioxide does not substantially change the effect.

What is claimed is:

1. A patterned substrate comprising a first metal pattern overlying a substrate and a second metal pattern on the side of said substrate opposing said overlying metal pattern wherein the thickness of said substrate is less than about 1.25 mm and said substrate includes a light scattering medium, and said substrate further includes a dye capable of fluorescing upon interacting with light, wherein said dye is distributed in regions of said substrate underlying or overlying said first metal pattern and said second metal pattern, and wherein said dye has a chemical structure represented by a member chosen from the group consisting of (1)

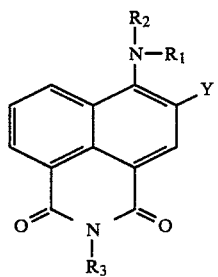

and (2)

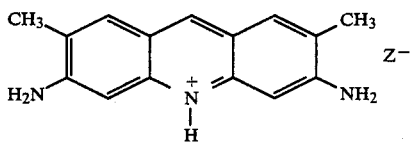

where Y is SO$_3$G, (G is an alkali metal cation), or H, R$_1$ and R$_2$ are individually hydrogen, methyl, or ethyl, and R$_3$ is a lower alkyl, p-tolyl, xylyl, or hydrogen, and Z$^-$ is Cl$^-$, Br$^-$, I$^-$, NO$_3^-$, or p-toluenesulfonate.

2. The patterned substrate of claim 1 wherein said light scattering medium comprises titanium dioxide.

3. The patterned substrate of claim 1 wherein said substrate comprises a cured epoxy resin.

4. The patterned substrate of claim 3 wherein said dye is chemically bound to said substrate.

5. The patterned substrate of claim 4 wherein said light scattering medium comprises titanium dioxide.

6. The patterned substrate of claim 4 wherein said first metal pattern and said second metal pattern comprise copper metal patterns.

7. The patterned substrate of claim 1 wherein said dye denominated (1) is employed where R$_1$, R$_2$ and R$_3$ are hydrogen and where said dye is reacted with bisphenol-A diglycidyl ether.

8. A process for detecting flaws in a first metal pattern which is formed on a substrate that has a second metal pattern on the side of said substrate opposing said metal pattern comprising the steps of illuminating said substrate with a source of electromagnetic radiation, detecting the resulting fluorescence from said substrate, and further processing said substrate on the basis of said detection wherein the thickness of said substrate is less than about 1.25 mm and said substrate includes a electromagnetic radiation scattering medium, and said substrate includes a dye capable of fluorescing, wherein said dye is distributed in regions of said substrate underlying or overlying said first metal pattern and said second metal pattern, and wherein said dye comprises a material having a chemical structure represented by a member chosen from the group consisting of (1)

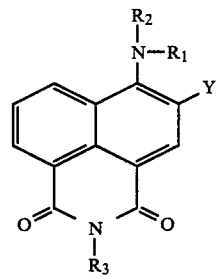

and (2)

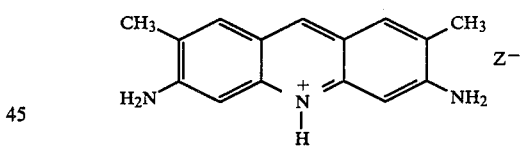

where Y is SO$_3$G or hydrogen, G is an alkali metal cation, R$_1$ and R$_2$ are individually hydrogen, methyl, or ethyl, and R$_3$ is a lower alkyl, p-tolyl, xylyl, or hydrogen, and Z$^-$ is Cl$^-$, Cr$^-$, I$^-$, NO$_3^-$ or p-toluenesulfonate.

9. The process of claim 7 wherein said scattering medium comprises titanium dioxide.

10. The process of claim 7 wherein said substrate comprises a cured epoxy resin.

11. The process of claim 9 wherein said dye is chemically bound to said substrate.

12. The process of claim 10 wherein said scattering medium comprises titanium dioxide.

13. The process of claim 10 wherein said first metal pattern and said second metal pattern comprise copper metal patterns.

14. The process of claim 7 wherein said dye denominated (1) is employed, where R$_1$, R$_2$ and R$_3$ are hydrogen and where said dye is reacted with bisphenol-A diglycidyl ether.

* * * * *